United States Patent
La Rosa et al.

(10) Patent No.: US 9,224,482 B2
(45) Date of Patent: Dec. 29, 2015

(54) HOT-CARRIER INJECTION PROGRAMMABLE MEMORY AND METHOD OF PROGRAMMING SUCH A MEMORY

(71) Applicant: STMicroelectronics (Rousset) SAS, Rousset (FR)

(72) Inventors: Francesco La Rosa, Rousset (FR); Stephan Niel, Greasque (FR); Arnaud Regnier, Les Taillades (FR); Julien Delalleau, Aix-en-Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/528,780

(22) Filed: Oct. 30, 2014

(65) Prior Publication Data

US 2015/0117109 A1    Apr. 30, 2015

(30) Foreign Application Priority Data

Oct. 31, 2013 (FR) ..................... 13 60743

(51) Int. Cl.
| | |
|---|---|
| *G11C 16/00* | (2006.01) |
| *G11C 16/10* | (2006.01) |
| *G11C 16/34* | (2006.01) |
| *G11C 16/04* | (2006.01) |
| *H01L 29/788* | (2006.01) |
| *H01L 27/115* | (2006.01) |
| *H01L 29/423* | (2006.01) |

(52) U.S. Cl.
CPC ............ *G11C 16/10* (2013.01); *G11C 16/0425* (2013.01); *G11C 16/0433* (2013.01); *G11C 16/34* (2013.01); *H01L 27/11524* (2013.01); *H01L 29/42328* (2013.01); *H01L 29/42336* (2013.01); *H01L 29/7881* (2013.01)

(58) Field of Classification Search
CPC .... G11C 16/10; G11C 16/34; G11C 16/0425; G11C 16/0433; H01L 29/7881; H01L 29/42338; H01L 29/42336; H01L 27/11524
USPC .............. 365/185.18, 185.05, 185.23, 185.28
See application file for complete search history.

(56) References Cited

U.S. PATENT DOCUMENTS

| | | | |
|---|---|---|---|
| 5,495,441 | A | 2/1996 | Hong |
| 5,745,410 | A | 4/1998 | Yiu et al. |
| 6,496,417 | B1 | 12/2002 | Shiau et al. |
| 2001/0021117 | A1* | 9/2001 | Cavaleri ................... G11C 7/10 365/1 |
| 2002/0153546 | A1 | 10/2002 | Verhaar |

(Continued)

FOREIGN PATENT DOCUMENTS

FR         2 987 697 A1    9/2013

*Primary Examiner* — Tan T. Nguyen
(74) *Attorney, Agent, or Firm* — Seed IP Law Group PLLC

(57) ABSTRACT

The present disclosure relates to a memory comprising at least one word line comprising a row of split gate memory cells each comprising a selection transistor section comprising a selection gate and a floating-gate transistor section comprising a floating gate and a control gate. According to the present disclosure, the memory comprises a source plane common to the memory cells of the word line, to collect programming currents passing through memory cells during their programming, and the selection transistor sections of the memory cells are connected to the source plane. A programming current control circuit is configured to control the programming current passing through the memory cells by acting on a selection voltage applied to a selection line.

19 Claims, 7 Drawing Sheets

(56) References Cited

U.S. PATENT DOCUMENTS

| | | | |
|---|---|---|---|
| 2002/0175394 A1 | 11/2002 | Wu et al. | |
| 2004/0109354 A1 | 6/2004 | Wang et al. | |
| 2005/0052918 A1* | 3/2005 | Dormans | H01L 27/115 |
| | | | 365/222 |
| 2006/0158930 A1 | 7/2006 | Thomas | |
| 2006/0280000 A1 | 12/2006 | Thomas | |
| 2009/0242959 A1 | 10/2009 | Lin et al. | |
| 2010/0133602 A1 | 6/2010 | Do et al. | |
| 2013/0250700 A1 | 9/2013 | La Rosa | |

* cited by examiner

HOT-CARRIER INJECTION PROGRAMMABLE MEMORY AND METHOD OF PROGRAMMING SUCH A MEMORY

BACKGROUND

1. Technical Field

The present disclosure relates to integrated circuit memories comprising split gate memory cells, each comprising a selection transistor section and a floating-gate transistor section. The selection transistor section comprises a selection gate and the floating-gate transistor section comprises a floating gate and a control gate.

2. Description of the Related Art

So-called "split gate" memory cells are conventionally programmed by hot-electron injection (or "hot-carrier injection"). Compared to tunnel-effect programming, programming by hot electrons has the advantage of being short, generally 100 times shorter than tunnel-effect programming. For a better understanding, the programming time of a memory cell by hot-electron injection is typically in the order of a few microseconds compared to a few milliseconds for tunnel-effect programming.

During hot-electron programming, the two transistor sections of the memory cell cooperate in order to inject electric charges into the floating gate. The selection transistor section has a conductive channel in which a current appears, which comprises high kinetic energy electrons, referred to as "hot electrons". When this current reaches the conductive channel of the floating-gate transistor section, an injection zone appears where the high energy electrons are injected into the floating gate under the effect of a transverse electric field created by the voltage applied to the control gate.

To obtain a good injection performance, one should ensure that the selection transistor section operates in saturated mode so that its conductive channel has a pinch zone in the vicinity of the injection zone. The concentration of the current in the pinch zone favors the appearance of high kinetic energy electrons, the injection performance then being maximized. This saturated operating mode of the selection transistor section is also referred to as "weak-inversion" or "subthreshold" (operating mode below the threshold voltage).

The saturated operating mode of the selection transistor section is conventionally obtained by imposing a low programming current in the memory cell, by means of a current source, while the drain-source voltage of this transistor section adjusts automatically to the imposed current, by cascode effect. This configuration is shown in FIG. 1, which shows the arrangement of a split gate memory cell $C1_{i,j}$ in a word line $WL_i$ of a memory array, and the arrangement of the above-mentioned current source, designated by the reference IG1.

The selection gate SG of the selection transistor ST section of the memory cell is connected to a selection line $SL_i$ and the control gate CG of the floating-gate transistor FGT section is connected to a control gate line $CGL_i$. The drain D of the selection transistor section is connected to a bit line $BL_j$ and the source S of the floating-gate transistor FGT section is connected to a source line $SCL_i$. The selection $SL_i$, control gate $CGL_i$ and source $SCL_i$ lines are parallel and linked to all the memory cells of the word line. The bit line $BL_j$ is transverse to the lines $SL_i$, $CGL_i$, $SCL_i$ and is also connected to memory cells belonging to other word lines (not represented).

The current source IG1 is arranged between the end of the bit line $BL_j$ and the ground. The selection line $SL_i$ receives a selection voltage $VS_i$, the control gate line $CGL_i$ receives a gate voltage $VG_i$ and the source line $SCL_i$ receives a source line voltage VSL. Voltage VG is generally high, for example 10V, to generate in the channel of the floating-gate transistor FGT section a transverse electric field favoring the injection of electrons into the floating gate. Voltage VSL is sufficiently high, for example 4V, to ensure the conduction of the memory cell. The selection voltage VS is generally set at any value greater than the threshold voltage of the selection transistor section, for example between 1V and 3V, the saturated operating mode of the selection transistor ST section being imposed by the current source IG1. The programming current imposed by the current source IG1 thus circulates from the source line $SCL_i$ to the bit line $BL_j$. A flow of electrons circulating in the opposite direction to the current passes through the channel of the selection transistor section until it reaches the pinch zone, and then the injection point into the channel of the floating-gate transistor section.

Offsetting their good injection performance, split gate memory cells have the disadvantage of occupying more semiconductor surface than conventional flash memory cells, that are also programmed by hot-electron injection but comprise only one control gate.

U.S. Pat. No. 5,495,441 discloses a so-called "split gate" memory cell the selection transistor section of which is arranged vertically to reduce the footprint of the memory cell. FIG. 2 corresponds to FIG. 7 of that document and shows a cross-section of the structure of such a memory cell. The numerical references in FIG. 2 are those of the original FIG. 7 of the aforementioned document. The memory cell C2 shown in FIG. 2 comprises a trench etched in a substrate (27) after forming a floating gate FG (28) made of polysilicon (polycrystalline silicon) above the substrate. The trench has then been covered with an oxide layer (200a, 200b). A conductive layer made of polysilicon (26) has then been deposited on the entire memory cell. The conductive layer (26) has a portion extending in the trench and forming a vertical selection gate SG, a portion extending over the floating gate FG (28) forming a horizontal control gate CG, the rest of the conductive layer forming a selection line SL of the memory cell. A doped region (21) implanted in the substrate forms a bit line BL and doped regions (20) implanted at the bottom of the trench form "source bit lines" SBL that are parallel to the bit line BL (21). The memory cell C2 thus comprises a selection transistor ST section having a vertical channel of length L1, and a floating-gate transistor FGT section having a horizontal channel of length L2, which cooperate to form a transistor having a channel of length L1+L2. The control CG and selection SG gates of the two transistor FGT, ST sections are formed by the same conductive layer (26) and therefore form a single component. The memory cell C2 is formed together with a memory cell C2' linked to the same selection line SL (26) and to the same bit line BL (21), but to a different "source bit line" SBL' (20).

As shown in FIG. 3, this structure of memory cell C2, C2' has a memory array architecture that differs greatly from the conventional architecture shown in FIG. 1. The sources S of the selection transistor ST sections of the two twin memory cells are connected to the "source bit lines" SBL (20), SBL' (20) that are parallel to the bit line BL (21). The selection line SL (26), and the gates SG (26) and CG (26) of the memory cells are at the same electric potential, the gates SG and CG thus forming a single selection/control gate. The programming of the memory cell C2 requires arranging the current source IG1 on the side of the selection transistor ST section, i.e., here in the "source bit line" SBL.

This memory cell structure offers a low footprint thanks to the vertical arrangement of the selection transistor section. On the other hand, it involves a multiplication of the number of source lines, in the form of "source bit lines" SBL, thus entailing a multiplication of the means for switching voltages in the memory array. For example, a word line comprising 1,024 memory cells would have 512 bit lines and 1,024 "source bit lines" parallel to the bit lines, compared to 1,024 bit lines and a single source line in a conventional architecture of the type shown in FIG. 1. Moreover, providing a single gate forming both a control gate and a selection gate does not enable the injection performance to be controlled as efficiently as with a conventional split gate memory cell of the type represented in FIG. 1.

From the prior art that has just been presented, it will be noted that the control of the programming current by means of a current source involves placing the current source in a line connected individually to a first terminal of the memory cell, i.e., a bit line BL in the memory array architecture in FIG. 1 or a "source bit line" SBL in the memory array architecture in FIG. 3, and applying to a second terminal of the memory cell the drain-source voltage or source-drain voltage of the memory cell making it conductive.

Thus, providing a selection transistor section having an embedded vertical gate involves an individualization in prior art and thus a multiplication of the source lines in the form of "source bit lines", to individually control the programming currents applied to each memory cell.

It could thus be desirable to provide a memory cell architecture and a method of programming such a memory cell whereby it is possible to benefit from certain advantages of the known architectures without some of their drawbacks.

BRIEF SUMMARY

Some embodiments of the present disclosure relate to an integrated circuit memory comprising at least one word line comprising a row of split gate memory cells each comprising a selection transistor section comprising an embedded vertical selection gate and a floating-gate transistor section comprising horizontal floating and control gates, a selection line to apply a selection voltage to the selection gates of the memory cells of the row, a control gate line to apply a gate voltage to the control gates of the memory cells of the row, bit lines to individually apply a programming current to the memory cells, and a source plane embedded beneath the memory cells and common to the memory cells of the word line, to collect programming currents for programming memory cells, wherein the selection transistor sections of the memory cells are connected to the source plane whereas the floating-gate transistor sections of the memory cells are connected to the bit lines.

According to one embodiment, the memory comprises a programming current control circuit configured to control the programming current passing through a memory cell by acting on the selection voltage applied to the selection line.

According to one embodiment, the programming current control circuit comprises at least one test memory cell, means for producing a reference current in the memory cell, and means for applying to the selection line a selection voltage taken at a terminal of the test memory cell.

According to one embodiment, the test memory cell has the same structure as the memory cells of the word line, and the programming current control circuit is configured to apply a DC voltage to the floating gate of the test memory cell.

According to one embodiment, the test memory cell has the same structure as the memory cells of the word line, and the programming current control circuit is configured to take the reference voltage at the selection gate of the selection transistor section of the test memory cell.

According to one embodiment, a terminal of the test memory cell is linked to a first input of a differential amplifier receiving a DC voltage at a second input, the output of the differential amplifier being linked to the selection gate of the selection transistor section of the test memory cell.

According to one embodiment, the programming current control circuit comprises a circuit to measure a current circulating in a bit line to which the memory cell to be programmed is connected, and a circuit to adjust the selection voltage so that the current measured in the bit line is equal or close to a reference current.

According to one embodiment, the current measuring circuit comprises at least one sense amplifier configured to apply a read voltage to the bit line and supply a binary datum which changes its logical value when a current higher than the reference current circulates in the bit line.

According to one embodiment, the programming current control circuit is configured to execute a phase of calibrating the selection voltage that includes determining, by successive approaches, a selection voltage that is such that the binary datum supplied by the sense amplifier changes its logic state, and execute a phase of programming the memory cell using as selection voltage a voltage that is equal to or a function of the selection voltage determined during the calibration phase.

According to one embodiment, the programming current control circuit comprises a computing unit capable of reading the output of the sense amplifier, and a voltage generator circuit controlled by the computing unit.

According to one embodiment, the selection gate of a memory cell is partially covered with the floating gate of the memory cell or is vertically aligned with a lateral dielectric layer covering the sides of the floating gate.

Some embodiments of the present disclosure also relate to a method of programming a memory cell of a memory according to the present disclosure, comprising a step of controlling a programming current passing through the memory cell by acting on a selection voltage applied to the selection line.

According to one embodiment, the method comprises a step of generating the selection voltage using a voltage taken from a test memory cell passed through by a reference current.

According to one embodiment, the method comprises a step of measuring a current circulating in the bit line to which the memory cell to be programmed is connected, and a step of adjusting the selection voltage so that the current measured in the bit line is equal or close to a reference current.

According to one embodiment, the method comprises a preliminary calibration step for calibrating the selection voltage that includes determining, by successive approaches, a read selection voltage for read selecting the memory cell corresponding to a determined read current, and the step of programming the memory cell is conducted using as programming selection voltage a voltage that is equal to or a function of the read selection voltage determined during the calibration step.

BRIEF DESCRIPTION OF THE SEVERAL VIEWS OF THE DRAWINGS

Some embodiments of a split gate memory cell according to the present disclosure and of a method of programming such a memory cell will be described below in relation with, but not limited to, the following figures in which.

DETAILED DESCRIPTION

Figure 4:
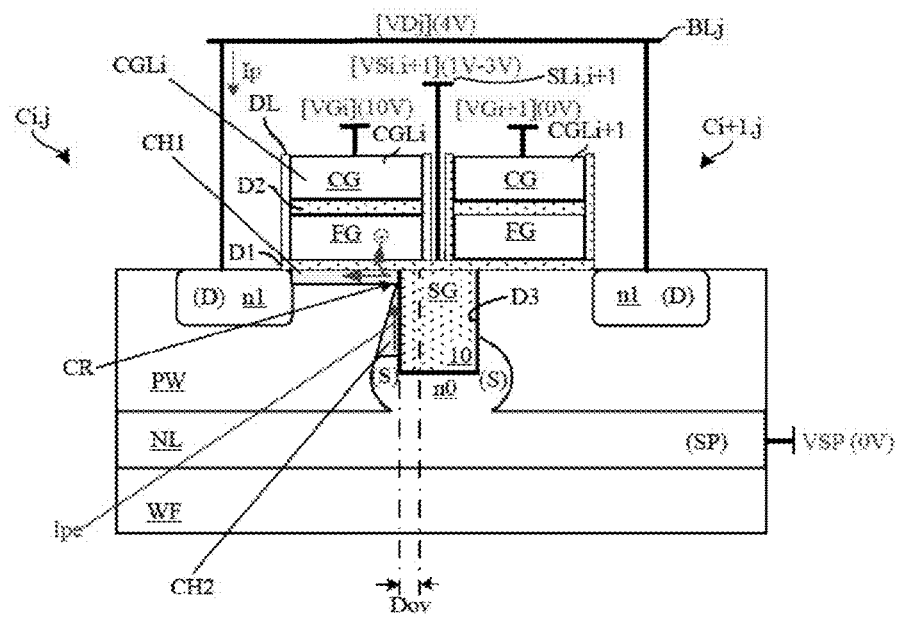
FIG. 4 is a cross-section of a first embodiment of a memory cell according to the present disclosure.

FIG. 4 is a cross-section of a memory cell $C_{i,j}$ according to the present disclosure. The memory cell comprises a floating gate FG formed on a substrate PW through a tunnel dielectric layer D1, a horizontal control gate CG formed on the floating gate FG through a dielectric layer D2, and a vertical selection gate SG. The vertical selection gate SG is formed in a trench 10 made in the substrate PW and covered with a dielectric layer D3. The gates SG, FG, CG are for example made of polysilicon. The vertical edges of the gate stack FG, CG are covered with a lateral dielectric layer DL. The substrate PW is here a P-type well produced on a P-type wafer WF. The lower portion of the vertical gate extends up to an N-type doped region n0 that has been implanted from the bottom of the trench 10 before forming the gate SG. The region n0 extends down to a deep doped layer NL, that is here the isolation layer N of the well/substrate PW. The memory cell also comprises an N-doped region n1 implanted in the substrate by self-alignment with the gate stack. The memory cell is produced here at the same time as a twin memory cell $C_{i+1,j}$, formed on the other side of the vertical selection gate SG, the pair of twin memory cells having a symmetry axis passing through the vertical gate SG.

According to the present disclosure, the floating gate FG extends above a portion of the selection gate SG. The distance "Dov" between the proximal edge of the floating gate FG and the corresponding proximal edge of the selection gate SG is therefore negative here, and represents an overlap distance of the gates. To obtain such gate overlap, a theoretical overlap distance Dovt has been previously defined at the stage of designing the memory cell, taking into account a tolerance "T" of the manufacturing method. The overlap distance Dov obtained after manufacturing the memory cell is equal to the theoretical overlap distance Dovt plus or minus this tolerance, and is thus within the interval [Dovt−T; Dovt+T].

According to one embodiment, the theoretical overlap distance Dovt is equal to T, to obtain an overlap distance Dov within the interval [0; 2T]. In other words, the memory cell $C_{i,j}$ has, between the proximal edge of the gate stack FG, CG and the corresponding proximal edge of the vertical gate SG, an overlap distance Dov ranging from 0 to 2T, the zero value corresponding to a perfect alignment of the gate stack with the vertical gate SG. As an example, with a manufacturing method enabling a floating gate FG to be produced with a length in the order of 120 to 150 nm, a typical tolerance value T is in the order of 40 nm, and the width of the vertical gate SG is in the order of 150 to 300 nm. The overlap distance Dov is, in this case, within the interval [0; 80 nm].

Each memory cell $C_{i,j}$, $C_{i+1,j}$ thus has a floating-gate transistor section comprising a horizontal channel CH1 extending beneath the floating gate FG, a selection transistor section comprising a vertical channel CH2 extending opposite the vertical control gate SG, and a region CR common to the channel CH2 and to the channel CH1, obtained thanks to the overlapping Dov. The region n1 forms the drain D of the memory cell and thus also the drain of the floating-gate transistor section. The region n0 forms the source S of the memory cell and thus also the source of the selection transistor section. The layer NL forms a source plane SP of the memory cell, common to other memory cells formed on the same substrate PW.

The drain regions D of the two memory cells $C_{i,j}$, $C_{i+1,j}$ are linked to a same bit line $BL_j$ schematically represented in FIG. 4, generally produced in the form of a metallic track extending above the memory cell. The control gate CG of the memory cell $C_{i,j}$ is linked to a control gate line $CGL_i$ or forms a part of the control gate line $CGL_i$, and the latter can take the form of a strip of polysilicon whereof the portion extending above the floating gate FG forms the control gate CG. Similarly, the control gate CG of the memory cell $C_{i+1,j}$ is linked to a control gate line $CGL_{i+1}$ or forms a part thereof. Finally, the selection gate SG, common to the two memory cells $C_{i,j}$, $C_{i+1,j}$, is linked to a common selection line $SL_{i,i+1}$ produced in the form of a metallic track extending above the memory cell. Alternatively, the common selection line $SL_{i,i+1}$ is a strip of polysilicon which extends in the trench 10, passes through the substrate perpendicularly to the cutting plane, and forms the selection gate in its portion running alongside the gate stack FG, CG.

Figure 2:
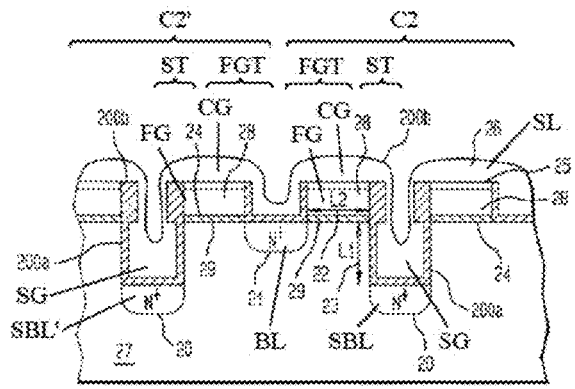

It will also be noted that the cutting plane in FIG. 4 is perpendicular to the cutting plane in FIG. 2. In FIG. 4, the bit line $BL_j$ is parallel to the cutting plane whereas the bit line BL in FIG. 2 is perpendicular to the cutting plane. Similarly, the selection line $SL_{i,i+1}$ is perpendicular to the cutting plane in FIG. 4 and the selection line SL is parallel to the cutting plane in FIG. 2. The memory cell structure in FIG. 4 thus leads to a very different memory array arrangement to the one shown in FIG. 3, which is represented in FIG. 5.

Figure 5:
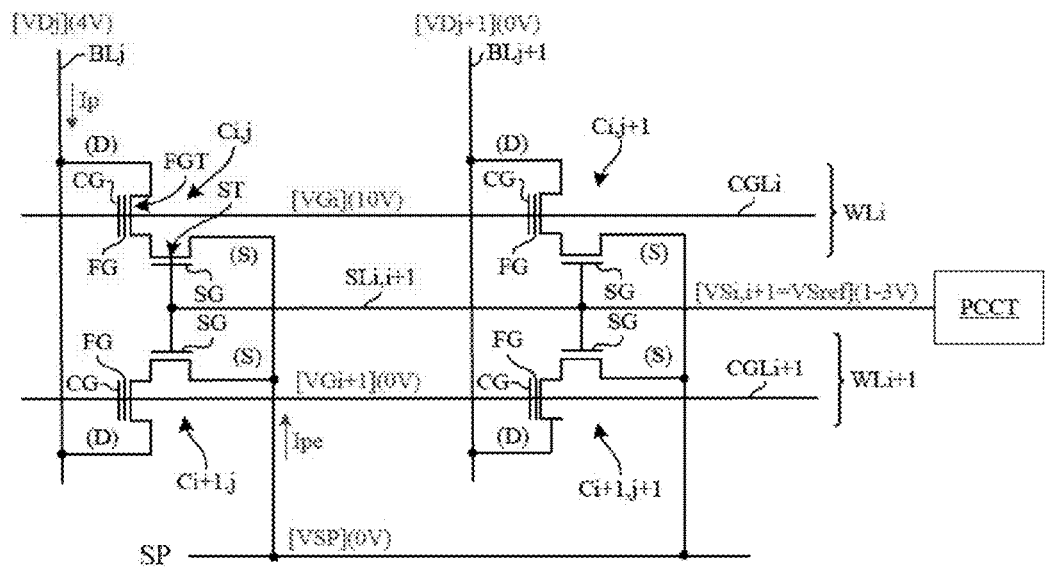
FIG. 5 shows a memory array architecture comprising a memory cell according to the present disclosure.

FIG. 5 shows two pairs of twin memory cells $C_{i,j}$, $C_{i+1,j}$, respectively $C_{i,j+1}$, $C_{i+1,j+1}$. The memory cells $C_{i,j}$, $C_{i,j+1}$ belong to a word line $WL_i$ and the memory cells $C_{i+1,j}$, $C_{i+1,j+1}$ belong to a twin word line $WL_{i+1}$. The selection gates SG of the selection transistor ST sections of the four memory cells are linked to the same selection line $SL_{i,i+1}$ and the sources S of the memory cells are linked to the common source plane SP (embedded layer NL, Cf FIG. 4). The control gates CG of the floating-gate transistor FGT sections of the memory cells $C_{i,j}$ and $C_{i+1,j}$ are connected to a control gate line $CGL_i$, and the control gates CG of the memory cells $C_{i+1,j}$ and $C_{i+1,j+1}$ are connected to a control gate line $CGL_{i+1}$. The drains of the twin memory cells $C_{i,j}$, $C_{i+1,j}$ are linked to a bit line $BL_j$ and the drains of the twin memory cells $C_{i,j+1}$, $C_{i+1,j+1}$ are linked to a bit line $BL_{j+1}$.

The memory array thus only comprises one bit line per vertical row of memory cells. Each word line $WL_i$, $WL_{i+1}$ only comprises one control gate line $CGL_i$, $CGL_{i+1}$ and one selection line $SL_{i,i+1}$ common to the twin word line. The bit line $BL_j$ receives a drain voltage $VD_j$ and the bit line $BL_{j+1}$ receives a drain voltage $VD_{j+1}$. The control gate line $CGL_i$ receives a gate voltage $VG_i$ and the control gate line $CGL_{i+1}$ receives a gate voltage $VG_{i+1}$. The selection line $SL_{i,i+1}$ receives a selection voltage $VS_{i,i+1}$. The source plane SP receives a source voltage VSP.

Figure 1:
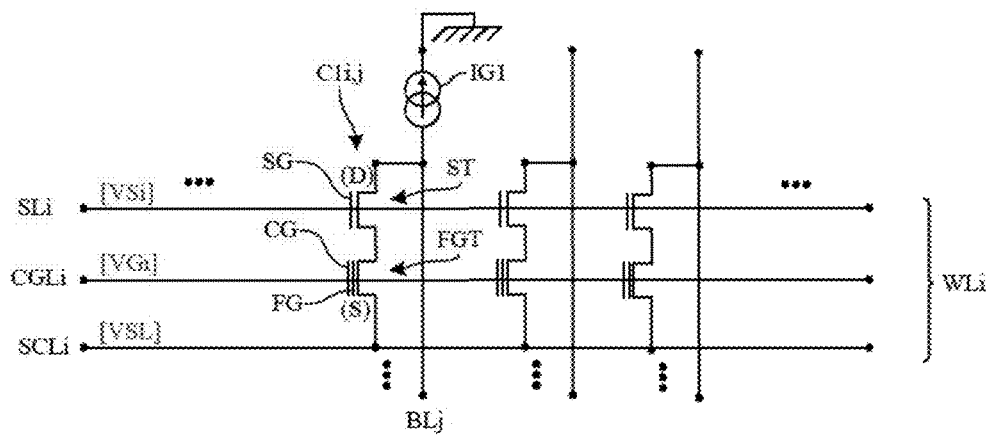
FIG. 1 described above shows a conventional memory array architecture comprising split gate memory cells, FIG. 2 described above is a cross-section of a conventional split gate memory cell having a vertical selection gate, FIG. 3 described above shows a memory array architecture receiving the memory cell in FIG. 2.

The memory array thus comprises a small number of interconnection lines and its structure is similar to that of a memory array of the type shown in FIG. 1, while benefiting firstly from the advantage offered by a memory cell having its selection transistor section arranged vertically, in terms of footprint, and secondly from the advantage offered by having distinct control and selection gates for the optimization of the programming process.

On the other hand, this structure of memory array and of memory cells does not enable a current source to be used to control the programming current for programming a memory cell. Indeed, the sources S of the selection transistor sections, which form the sources of the memory cells, are here connected to the common source plane SP. As this source plane collects the programming currents for programming all the memory cells programmed simultaneously, any control of the current passing through the source plane would lead to a non-controllable distribution of fractions of this current in the various memory cells programmed at the same time. Similarly, the bit lines cannot receive a current source as they must receive the drain-source voltage of the memory cells making them conductive.

Some embodiments of the present disclosure thus relate to a programming method that does not require current sources to be inserted into the conductive paths of the memory array to control the programming current.

This method relies on a voltage control of the programming current by acting on the selection voltage VS applied to the selection gates of the memory cells. This method is shown in FIG. 5, which shows as an example the programming of the memory cell $C_{i,j}$:

- the voltage $VD_j$ applied to the bit line $BL_j$ is taken to a sufficient value, for example 4V, to put the memory cell into the conductive state (drain-source voltage of the memory cell),
- the voltage $VD_{j+1}$ applied to the bit line $BL_{j+1}$ is reset so as not to program the memory cell $C_{i,j+1}$ (or is put to 4V if this memory cell must be simultaneously programmed),
- the voltage $VG_i$ applied to the control gate line $CGL_i$ is taken to a high value, for example 10V, so as to produce in the channel a high electric field capable of favoring the injection of hot electrons into the floating gate (this voltage is therefore much higher than the voltage that would be sufficient to put the floating-gate transistor section into the non-saturated operating mode, characterized by the relation VGS−Vth>VDS),
- the voltage $VG_{i+1}$ applied to the control gate line $CGL_{i+1}$ is reset so as not to program at the same time memory cells of the word line $WL_{i+1}$,
- the source plane SP is taken to a zero voltage VSP (ground potential), and
- the selection voltage $VS_{i,i+1}$ applied to the selection line $SL_{i,i+1}$ is taken to a value VSref, for example a value between 1 and 3V, supplied by a programming current control circuit PCCT implementing the method according to the present disclosure.

The circuit PCCT controls the selection voltage VSref so that the programming current Ip passing through the memory cell is equal or close to a reference current Ipref considered optimal for the injection performance of the memory cell. This current is such that the selection transistor section of the memory cell is in the saturated state so that a pinch zone of the channel appears in the vicinity of the injection zone, favoring the appearance of hot electrons.

The process for programming the memory cell is also shown in FIG. 4. A programming current Ip equal or close to the optimal current Ipref circulates from the drain D (n1) to the source S (n0) of the memory cell $C_{i,j}$. A flow of electrons Ipe circulates in the opposite direction to this current. The Ipe flow of electrons passes through the vertical channel CH2 opposite the selection gate SG, reaches the region CR common to the channel CH2 and to the channel CH1, then passes through the channel CH1 to join the drain region n1. The vertical channel CH2 has a pinch zone in the common region CR where hot electrons are concentrated. These are injected into the floating gate FG, under the effect of the transverse electric field created by the voltage $VG_i$, in an injection zone situated in the channel CH2 and more particularly in the common region CR or close to the latter. The channels CH1, CH2 thus cooperate in the injection mechanism due to the fact that the end of the channel CH2 opens into the channel CH1 (common region CR), this feature being obtained here by the fact that the gate stack FG, CG partially overlaps the vertical selection gate SG.

Figure 6:
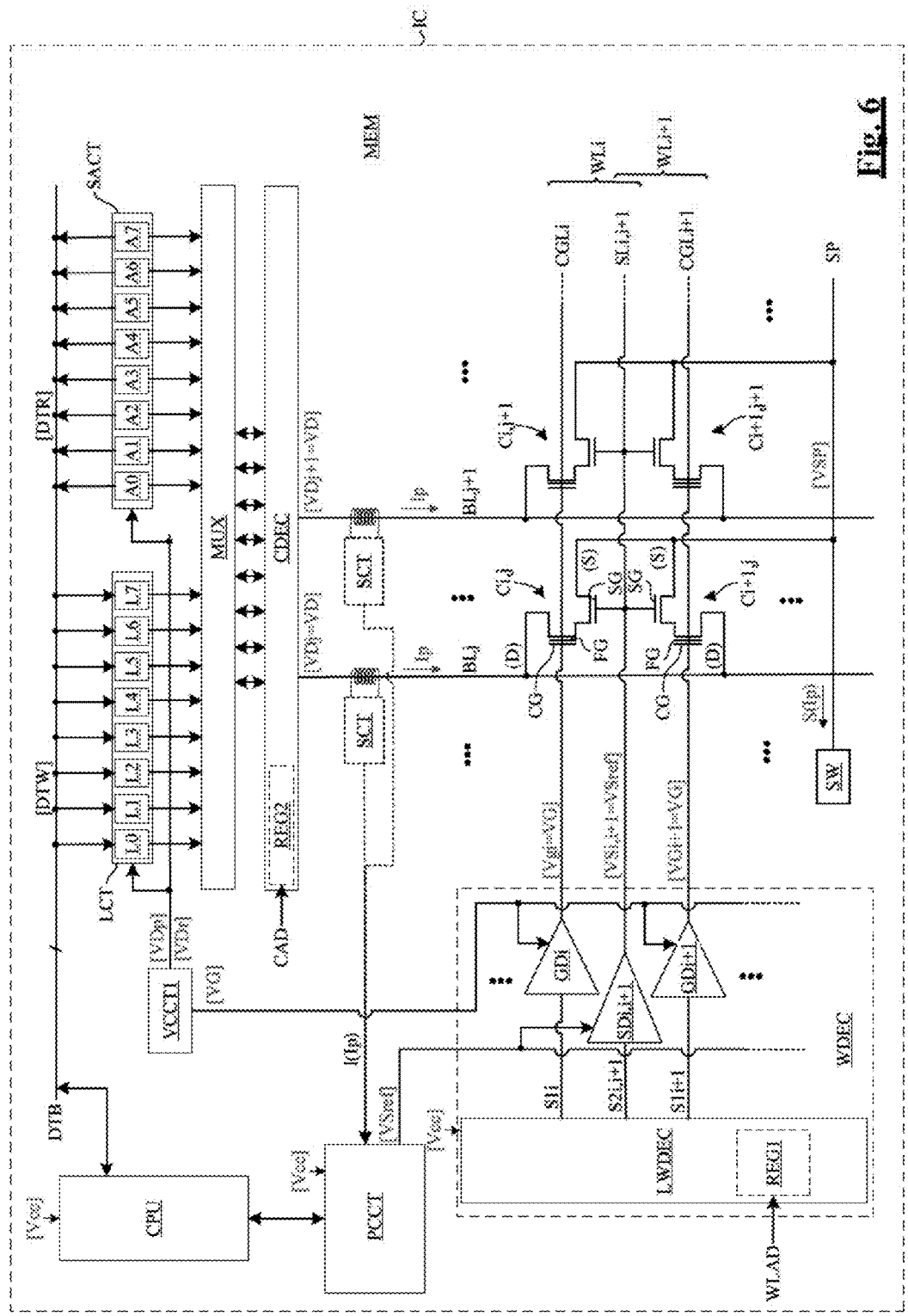
FIG. 6 shows the general architecture of a memory according to the present disclosure.

FIG. 6 shows the general architecture of a memory MEM according to the present disclosure, produced in the form of an integrated circuit IC on a semiconductor chip. The memory comprises a memory array comprising memory cells according to the present disclosure arranged in the manner described above in relation with FIG. 5. For the sake of legibility of the drawings, only the word lines $WL_i$, $WL_{i+1}$ and the memory cells $C_{i,j}$, $C_{i+1,j}$, $C_{i,j+1}$, $C_{i+1,j+1}$ described above and the corresponding control lines $CGL_i$, $CGL_{i+1}$, $SL_{i,i+1}$, $BL_j$, $BL_{j+1}$ are represented.

The memory MEM also comprises a word line decoder WDEC, a column decoder CDEC, a multiplexer MUX, a read circuit SACT, a programming circuit LCT, a data bus DTB, a voltage control circuit VCCT1, and the programming current control circuit PCCT. These various elements are controlled by a microprocessor or hard-wired logic (state machine) central unit CPU. Other elements that are conventional per se are not represented for the sake of simplicity, such as an address bus, a control bus enabling the unit CPU to control the aforementioned elements, an input/output circuit enabling the unit CPU to receive commands for reading or writing data and to supply responses to these commands.

The decoder WDEC comprises an address register REG to store a word line address WLAD, a decoding logic circuit LWDEC to decode the word address, gate drivers GD and selection drivers SD, only the drivers $GD_i$, $GD_{i+1}$, $SD_{i,i+1}$ of the word lines $WL_i$, $WL_{i+1}$ being represented in FIG. 6. The drivers GD, SD are controlled by the decoding circuit LWDEC by means of selection signals S1 and S2. Each gate driver GD has an output linked to a control gate line CGL and each selection driver SD has an output linked to a selection line SL. The drivers SD receive the reference selection voltage VSref supplied by the circuit PCCT according to the present disclosure and the drivers GD receive a gate voltage VG supplied by the circuit VCCT1. The drivers SD apply the voltage VSref to the selection lines to which they are linked when they are selected by the decoding circuit LWDEC, and the drivers GD apply the voltage VG to the control gate lines to which they are linked when they are selected by the decoding circuit. In the example represented, the driver $SD_{i,i+1}$ supplies the line $Sl_{i,i+1}$ with a voltage $VS_{i,i+1}$ equal to VSref when it receives a signal $S2_{i,i+1}$ on 1 meaning that one of the word lines $WL_i$, $WL_{i+1}$ is designated by the address WLAD. The driver $GD_i$ supplies the line $CGL_i$ with a voltage $VG_i$ equal to VG when it receives a signal $S1_i$ on 1 meaning that the word line $WL_i$ is designated by the address WLAD. The driver $GD_{i+1}$ supplies the line $CGL_{i+1}$ with a voltage $VG_i$ equal to VG when it receives a signal $S1_{i+1}$ on 1 meaning that the word line $WL_{i+1}$ is designated by the address WLAD.

The column decoder CDEC comprises an address register REG2 to store a column address CAD and is configured to link to the multiplexer MUX a group of bit lines designated by this address. The multiplexer MUX is configured to link the selected group of bit lines to the programming circuit LCT or to the read circuit SACT, based on a command supplied by the unit CPU. The circuit LCT here comprises eight programming latches L0 to L7 and the read circuit SACT comprises eight sense amplifiers A0 to A7. Each programming latch comprises an output to supply a drain voltage VDp when programming a memory cell, and each sense amplifier comprises an output to supply a drain voltage VDp when reading a memory cell. Each programming latch also comprises an input linked to a wire of the data bus DTB, to receive a bit of a datum DTW to be written in a memory cell, and each sense amplifier A0-A7 comprises an output linked to the bus DTB to supply a data bit DTR read in a memory cell. The voltages VDp, VDr are here supplied by the voltage control circuit VCCT1 but can also be produced by the circuits LCT and SACT using a supply voltage Vcc of the memory. The voltage VSP of the source plane SP is supplied by a switch SW, and can for example be equal to 0, 5V, or HZ (high impedance state or open circuit).

Two embodiments of the programming current control method implemented by the circuit PCCT are possible. In the first embodiment, the current/voltage or voltage/current response from a test memory cell is used to supply the selection voltage VSref corresponding to the desired programming current. In the second embodiment, current sensor circuits SCT (schematically shown in dotted lines) are used to measure the current circulating in each bit line, and to adjust the selection voltage VS so that this current corresponds to the desired programming current.

Figure 7:
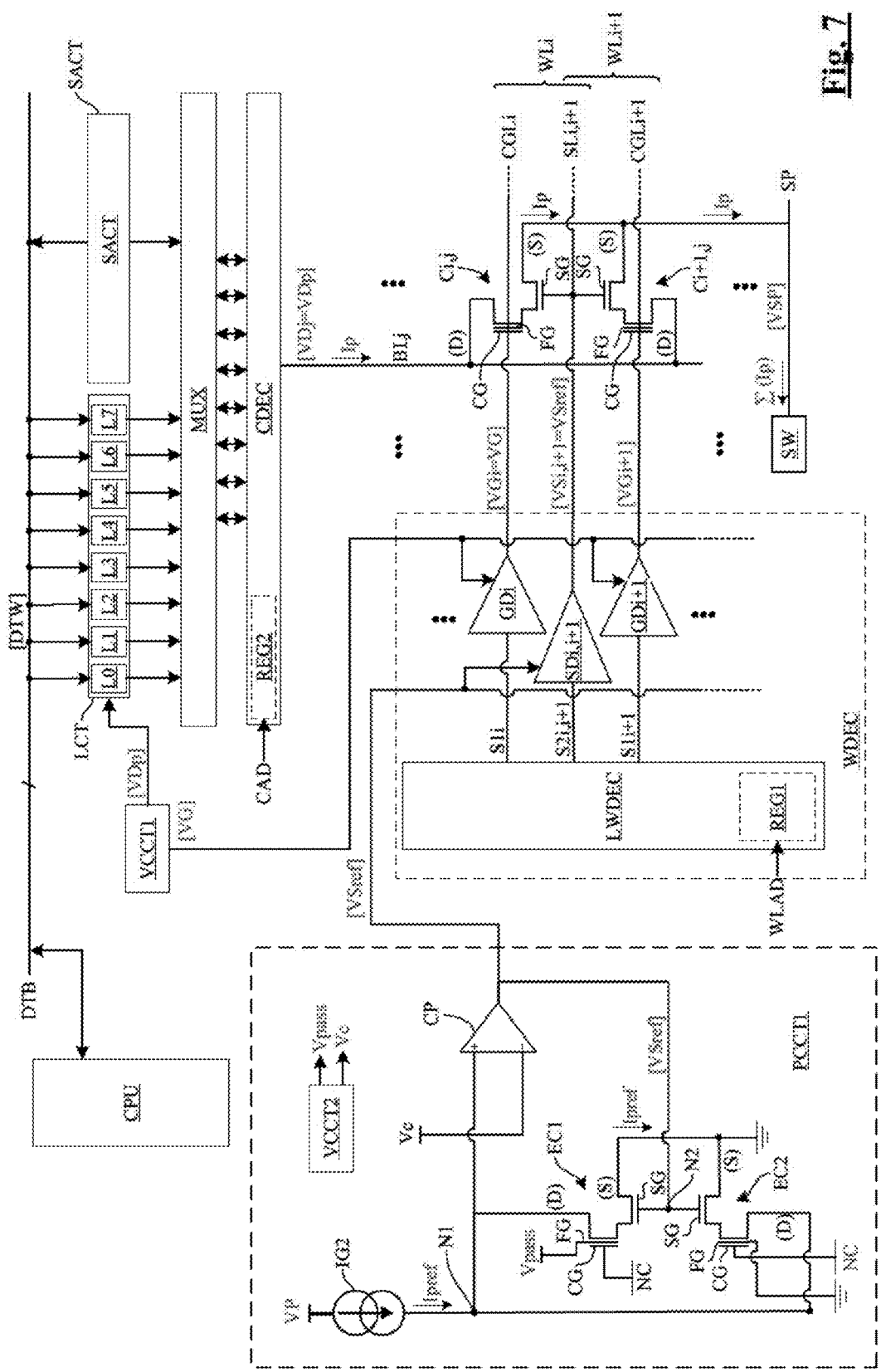
FIG. 7 shows a first embodiment of programming means for programming memory cells represented in block form in FIG. 6, FIGS. 8A, 8B show a second embodiment of programming means represented in block form in FIG. 7.

FIG. 7 shows one embodiment PCCT1 of the circuit PCCT implementing the first embodiment of the method, using here the voltage/current response from a test memory cell. The circuit PCCT1 here comprises two test memory cells EC1, EC2, a circuit VCCT2 supplying DC voltages Vpass and Vc, a current generator IG2, and a comparator CP produced for example with an operational amplifier. The memory cells EC1, EC2 are twin memory cells the structure of which is identical to functional twin memory cells of the memory array, and are manufactured at the same time as the functional memory cells, preferably near the memory array or in a dedicated zone of the memory array. They only differ from the functional memory cells by the fact that they have an additional electrical contact enabling their floating gate FG to be electrically accessed. The drain D of each test memory cell EC1, EC2 is linked to a terminal N1 of the voltage source IG2 the other terminal of which receives a bias voltage VP. The terminal N1 is also linked to the positive input of the comparator CP the negative input of which receives the voltage Vc. The source S of each memory cell is linked to the ground. The control gates CG of the two memory cells are left in the non-connected state (NC). The memory cell EC1 receives the voltage Vpass on its floating gate through the additional contact. The memory cell EC2 is not used here and its floating gate is connected to the ground to maintain the memory cell in the non-conductive state. The output of the comparator CP is connected to a node N2 linked to the selection gates SG of the two test memory cells, and supplies the selection drivers SD of the decoder WDEC with the selection voltage VSref.

The voltage source IG2 imposes the reference programming current Ipref in the memory cell EC1. The floating-gate transistor section of the memory cell EC1 is forced to the non-saturated conductive state by the voltage Vpass applied directly to the floating gate, to overcome the risk of accumulation of charges which would distort the electrical properties of the memory cell by modifying its threshold voltage. As the node N1 is coupled to the node N2 through the comparator CP, the voltage VSref is representative of the selection voltage to be applied to the functional memory cells to impose therein a programming current Ip equal or close to Ipref.

The programming of one or more memory cells comprises for example the following steps:
- the unit CPU first erases the memory cells that must be programmed,
- the unit CPU loads into the latches L0-L7 of the circuit LCT the bits of a word to be written DTW,
- the unit CPU loads the address WLAD//CAD of the word DTW into the decoders WDEC and CDEC,
- the unit CPU puts the multiplexer MUX into the "programming" configuration to link the decoder CDEC to the latches of the circuit LCT,
- the unit CPU activates the circuits LCT, VCCT1, PCCT1,
- the unit CPU puts the source plane SP to the ground by means of the switch SW,
- the programming latches L0-L7 receive the voltage VDp, supplied by the circuit VCCT1,
- the latches L0-L7 having received a data bit the logical value of which is the programming logical value, for example 1, supply the bit lines to which they are linked with the voltage VDp via the decoder CAD,
- the latches L0-L7 having received the erase logical value remain inactive to leave the corresponding memory cells in the erased state,
- the gate drivers GD receive the voltage VG supplied by the circuit VCCT1,
- the selection drivers SD receive the voltage VSref supplied by the circuit PCCT1,
- the driver GD designated by the address WLAD (here the driver $GD_i$) supplies the control gate line CG ($CGL_i$) to which it is linked with the gate voltage VG,
- the driver SD designated by the address WLAD (here the driver $SD_{i,i+1}$) supplies the selection line SL to which it is linked ($SL_{i,i+1}$) with the selection voltage VSref,
- the bit lines BL designated by the address CAD are linked to the outputs of the latches L0-L7 (a single bit line $BL_j$ being represented in FIG. 8A for the sake of simplifying the diagram),
- the memory cells of the word line designated by the address WLAD (here the word line $WL_i$), belonging to the column designated by the address CAD, and that are to receive the programming logical value (here the memory cell $C_{i,j}$), receive the voltages VD, VG, VSref and are programmed in the manner described above in relation with FIG. 5.

It will be understood by those skilled in the art that this embodiment of the programming method according to the present disclosure can be implemented in various other ways depending on the memory structure used, the structure of the decoders, and the means enabling the various voltages to be routed towards the memory cells. The programming current control circuit PCCT1 is itself susceptible of various other embodiments. According to one embodiment, the second test memory cell EC2 is used and receives the voltage Vpass on its floating gate FG. The current source IG2 is configured to supply a current equal to twice the current Ipref, so that each test memory cell receives the current Ipref. In another embodiment, the comparator CP is removed and the terminal N1 is connected to the node N2. Indeed, it will be noted that the comparator only enables the fan-out of the circuit PCCT1 to be improved, i.e., its ability to supply the line leading to the drivers SD with current so that the latter is rapidly biased by the voltage VSref despite any stray capacitances.

Also, one embodiment of the circuit PCCT1 can use the current/voltage response from the test memory cell, instead of using its voltage/current response. In this case, the current Ipref is not imposed by a current source. The current Ip passing through the test memory cell is measured by means of a current sensor, and the voltage VSref is adjusted by successive approaches until the current Ip is equal to the targeted optimal current Ipref.

Figure 8A:
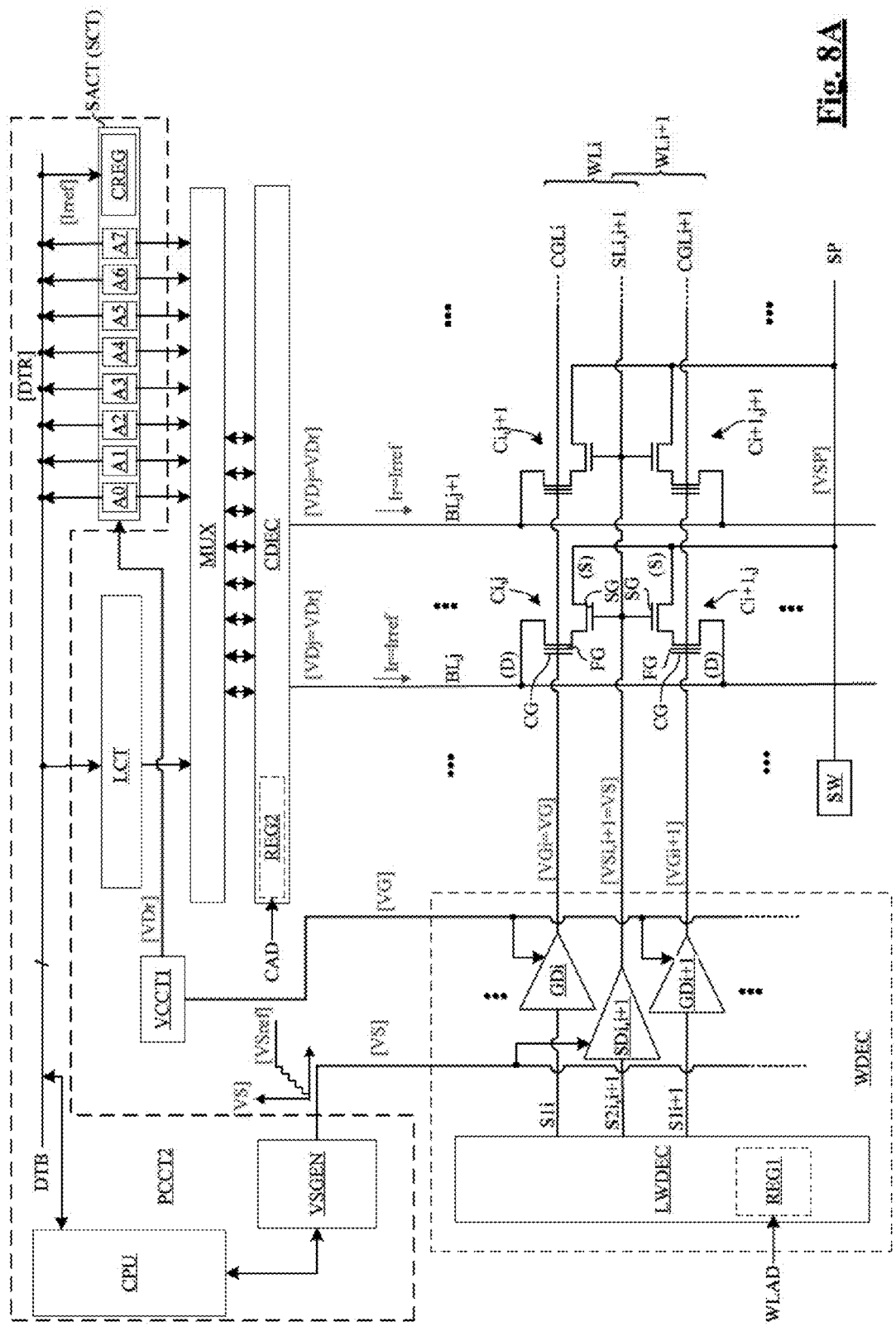
Figure 8B:
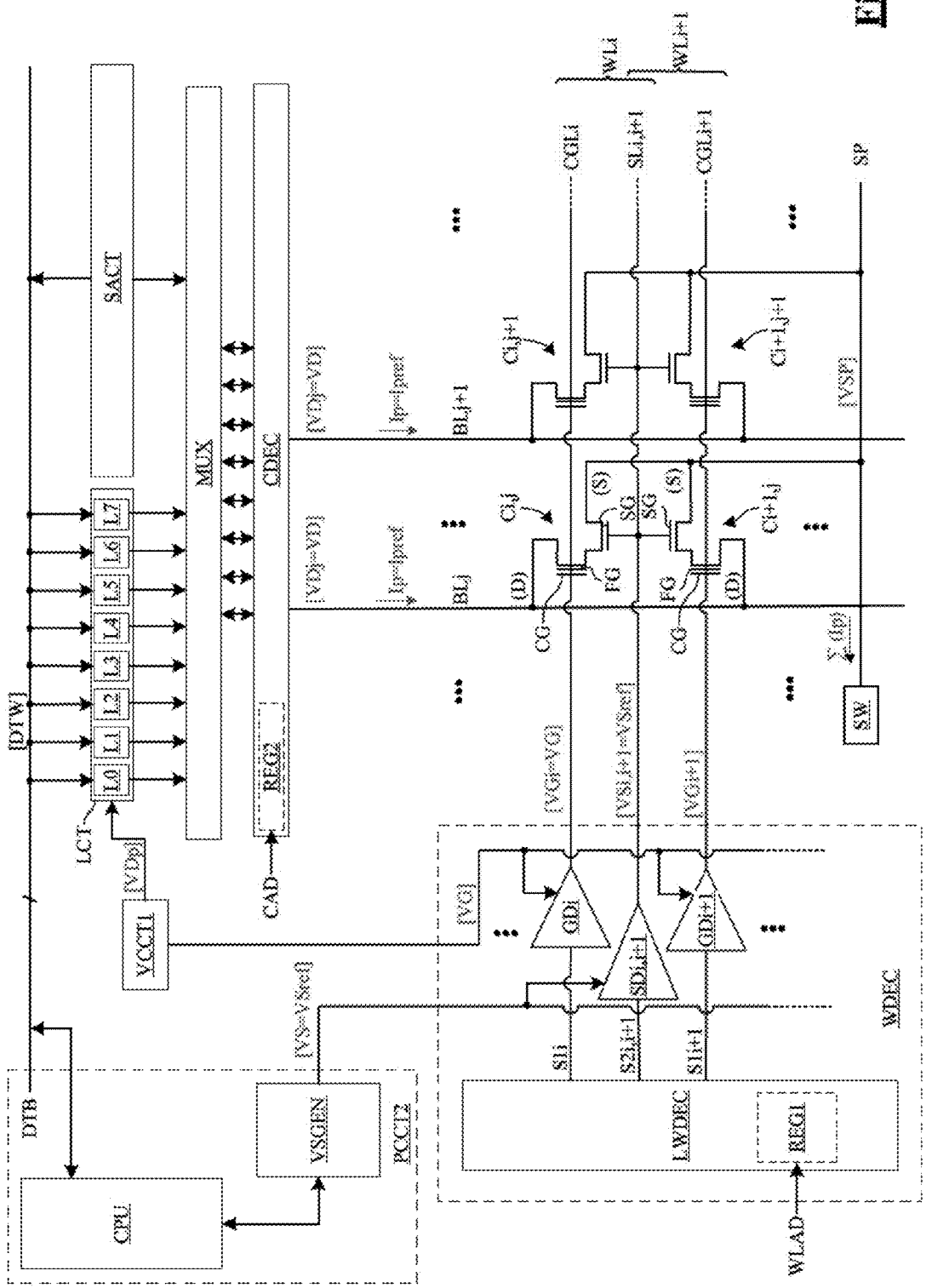

FIGS. 8A and 8B show one embodiment PCCT2 of the circuit PCCT implementing the second embodiment of the programming method according to the present disclosure. In this example of implementation of the method, the sense amplifiers of the memory A0-A7 are used as means for measuring the current circulating in the bit lines, to determine the selection voltage VSref enabling the targeted programming current Ipref to be obtained. For this purpose, the sense amplifiers used are of the type configurable by means of a register CREG connected to the data bus DTB, in which the unit CPU loads a read current threshold setpoint beyond which the output of the sense amplifiers A0-A7 changes its logic state.

This mode of executing the method avoids providing current sensors in each bit line. Indeed, a sense amplifier is after all nothing more than a binary current sensor supplying a bit having a first logical value, for example 0, when the current passing through the memory cell being read is below a current threshold, which indicates in normal use that the cell is in the erased state, or having a second logical value, for example 1, when the current passing through the memory cell is above the threshold, which indicates in normal use that the cell is in the programmed state (i.e., electric charges are present in the floating gate and lower the threshold voltage of the memory cell). This property is used here to detect a current threshold, instead of detecting the programmed or erased state of a memory cell.

The circuit PCCT2 thus comprises:
 the CPU, as a unit for executing the programming current control method,
 the sense amplifiers A0-A7 of the read circuit SACT, configurable by means of the register CREG, as current sensors SCT, and
 a voltage generator circuit VSGEN, controlled by the unit CPU, to supply the voltage VSref, for example a digital-to-analog converter or an analog voltage generator.

The programming current control method executed by the unit CPU comprises two phases:
 a calibration phase, comprising the reading of memory cells to be programmed, by means of the sense amplifiers A0-A7, and aiming to determine a selection voltage value VSref enabling a determined read current Irref to be obtained,
 a programming phase, comprising the programming of the memory cells by means of the programming latches L0-L7, using the selection voltage value VSref determined during the calibration phase, to obtain a programming current Ip equal or close to Ipref.

More particularly, the embodiment of the calibration phase described below aims to search for a read current Irref different from the targeted programming current Ipref, but corresponding in normal reading conditions to the same selection voltage VSref as the one enabling the current Ipref to be obtained in normal programming conditions. For a same selection voltage VSref, the difference between the current Irref and the current Ipref depends solely on the drain voltage applied to the memory cells, the gate voltage VG having little influence on the current when it is clearly greater than the threshold voltage of the floating-gate transistor section. The drain voltage is the voltage VDr supplied by the sense amplifiers during the reading phase, and the voltage VDp supplied by the programming latches during the programming phase. The voltage VDr is for example in the order of 1V, and the voltage VDp in the order of 4V as indicated above. The ratio Ipref/Irref is known by the designer of the memory cells, by calculation and/or tests. As the optimal programming current Ipref is also known as of the design of the memory cells, the current Irref is also known and is stored as a parameter accessible to the unit CPU to control the programming process.

FIGS. 8A and 8B respectively show the calibration phase and the programming phase in the case in which the memory cells $C_{i,j}$, $C_{i,j+1}$ of a word situated in the word line $WL_i$ must be programmed. Other memory cells of this word line, not represented, can also be simultaneously programmed.

With reference to FIG. 8A, the calibration phase comprises the following initialization steps:
 the unit CPU erases the memory cells to be programmed,
 the unit CPU loads the current setpoint Irref into the register CREG of the read circuit SACT,
 the unit CPU loads the address WLAD//CAD of the word into the decoders WDEC and CDEC,
 the unit CPU puts the multiplexer MUX into the "read" configuration to link the decoder CDEC to the outputs of the sense amplifiers A0-A7,
 the unit CPU activates the circuits SACT, VCCT1,
 the circuit VCCT1 supplies the gate drivers GD with a gate voltage VG in the order of a few volts, for example 4V,
 the unit CPU puts the source plane SP to the ground by means of the switch SW,
 the sense amplifiers receive the voltage VDr, here supplied by the circuit VCCT1, and apply it to the bit lines selected by the decoder CDEC,
 the gate driver GD designated by the address WLAD (here the driver GD) supplies the control gate line CGL to which it is linked (here CGL) with the gate voltage VG ($VG_i$=VG).

The unit CPU also applies to the generator VSGEN a first voltage setpoint, so that it supplies the selection drivers SD of the decoder WDEC with a first selection voltage value VS1. The selection driver SD designated by the address WLAD (here the driver $SD_{i,i+1}$) supplies the selection line SL to which it is linked ($SL_{i,i+1}$) with the selection voltage VS ($VS_{i,i+1}$=VS). The memory cells of the word line WL designated by the address WLAD, here the memory cells of the word line $WL_i$, thus receive the gate voltage VG and the first value VS1 of the selection voltage VS. The memory cells of the column selected and belonging to this word line are thus passed through by a read current Ir.

The unit CPU then reads the data supplied by the sense amplifiers A0-A7. It is assumed here that the logical value 1 means that the current threshold Irref has been reached. If not all of these data are on 1, the unit CPU increases the voltage VS supplied by the generator VSGEN and takes it to a value VS2, then again reads the data supplied by the sense amplifiers.

The unit CPU thus gradually increases the voltage VS until all the outputs of the sense amplifiers are on 1, which means that all the memory cells are passed through by a current equal to Irref, or close to the latter by higher values (due to any dispersions of the characteristics of the memory cells). The unit CPU then stores the value VSref of the selection voltage having enabled a current at least equal to Iref to be obtained in each of the selected memory cells.

In one alternative, the unit CPU stops the calibration phase when the outputs of the sense amplifiers connected to memory cells to be programmed have all changed to 1, without taking into account the outputs of the sense amplifiers connected to memory cells not to be programmed.

If the generator VSGEN is an analog-to-digital converter, the unit CPU can also proceed by dichotomy, i.e., alternate low and high values of the voltage VS to rapidly converge to a voltage value VSref close to the point at which the logic state of the sense amplifier outputs changes. If the generator VSGEN is a ramp generator, the unit CPU activates the ramp generator and repetitively reads the data supplied by the sense amplifiers, then blocks the ramp generator when such data are on 1. The ramp generator is then left in the activated state with the value VSref it supplies at the time it is blocked, to perform the next programming phase.

The programming phase, shown in FIG. 8B, comprises the following steps:
 the unit CPU loads the word to be written into the latches L0-L7 of the circuit LCT, and leaves the decoders WLAD, CAD in the configured state during the calibration phase,
 the unit CPU puts the multiplexer MUX into the "programming" configuration to link the decoder CDEC to the latches of the circuit LCT,
 the latches of the circuit LCT receive the voltage VDp, supplied by the circuit VCCT1,
 the latches L0-L7 having received a data bit the logical value of which is the programming logical value, for example 1, supply the bit lines to which they are linked with the voltage VDp via the decoder CAD,
 the latches L0-L7 having received the erase logical value remain inactive to leave the corresponding memory cells in the erased state,
 the circuit VCCT1 supplies the gate drivers GD with a high gate voltage VG, for example 10V,
 the selection drivers SD receive the voltage VSref determined during the calibration phase, supplied by the generator VSGEN,
 the driver GD designated by the address WLAD (here the driver $GD_i$) supplies the control gate line CGL to which it is linked (here $CGL_i$) with the gate voltage VG ($VG_i$=VG),
 the driver SD designated by the address WLAD (here the driver $SD_{i,i+1}$) supplies the selection line SL to which it is linked ($SL_{i,i+1}$) with the calibrated selection voltage VSref ($VS_{i,i+1}$=VSref),
 the bit lines BL designated by the address CAD are linked to the outputs of the latches L0-L7,
 the memory cells of the word line designated by the address WLAD (here the word line $WL_i$), belonging to the column designated by the address CAD, and that are to receive the programming logical value (here the memory cells $C_{i,j}$, $C_{i,j+1}$), receive the programming voltages VD, VG, VSref, and are programmed in the manner described above in relation with FIG. 5. The programming current Ip, determined by the voltage VSref, is equal or close to the target value Ipref.

Any inaccuracies on the current Ip in relation to the target value Ipref, which justify the use of the phrase "close to" above, are considered here to have little impact on the injection performance and are linked firstly to the smallness of the step of variation in the voltage VS used during the calibration phase to find the value VSref, to any dispersions of the electrical characteristics of the memory cells, and to any variation in the ratio Ipref/Iref that enabled Iref to be determined from Ipref.

This execution mode of the method of the present disclosure opts for a simple solution that includes predetermining the current Iref according to the targeted current Ipref, so that the voltage VSref enabling the current Iref to be obtained in known reading conditions corresponds to the voltage VSref enabling the current Ipref to be obtained in known programming conditions. In one alternative, the method could include a voltage conversion between the voltage VSref determined during the calibration phase and the voltage VSref to be used during the programming phase to obtain the target current Ipref.

The description above was of an example of split gate memory cell and memory array architecture in which the selection transistor section of the memory cell is connected to a source plane common to all the memory cells of a same well PW. This memory cell structure offers the advantage of a low footprint in terms of occupied semiconductor surface, without entailing any increase of the source lines and thus any increasing memory array complexity, and can further be programmed with a good injection performance by means of the method that has just been described.

Figure 9:
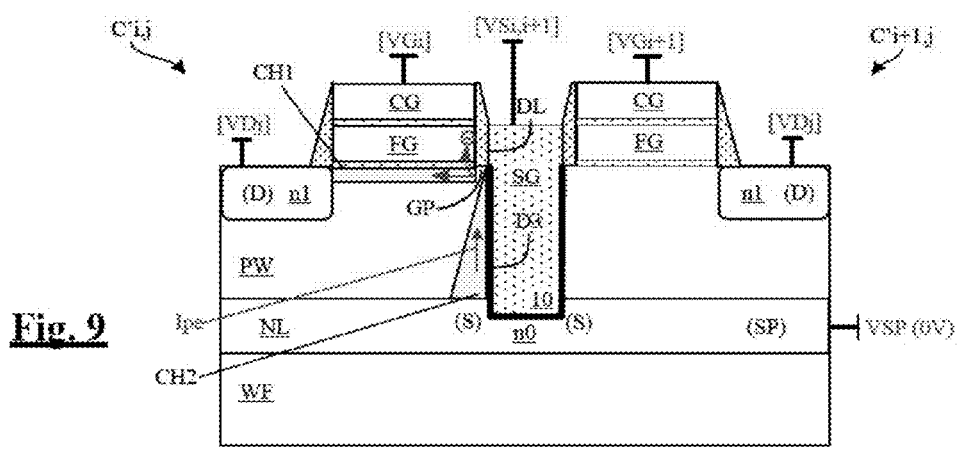
FIG. 9 is a cross-section of a second embodiment of a memory cell according to the present disclosure, and shows a step of programming the memory cell.

The example of memory cell architecture described above in relation with FIG. 4 is susceptible of other embodiments. FIG. 9 shows as an example a second embodiment of a memory cell $C'_{i,j}$ according to the present disclosure in which the floating gate FG does not extend above a portion of the selection gate SG, the distance between the proximal edge of the floating gate FG and the corresponding proximal edge of the selection gate SG thus here being positive.

In this embodiment, the trench 10 receiving the selection gate SG has been made after forming the gate stack FG, CG and depositing the lateral dielectric layer DL on the sides of the gate stack. More particularly, the trench has been made by dry anisotropic etching, for example plasma etching, self-aligned with the gate stack and the lateral dielectric layer DL, the edges of which have been slightly attacked by the etching. In this example, the trench 10 reaches the layer NL and it has not been necessary to implant the source region n0 shown in FIG. 3, the source region n0 being included in the layer NL. A source region n0 situated above the layer NL could however be provided, if a less deep vertical gate SG were desired (the height of the gate SG determining the length of the channel of the selection transistor section). As above, the memory cell has a horizontal channel region CH1 extending beneath the floating gate FG, and a vertical channel region CH2 extending opposite the selection gate SG. It also has a gap GP extending between the channel regions CH1, CH2, beneath the lateral dielectric layer DL and over a few tens of nanometers, not preventing the two channel regions from cooperating to enable the memory cell to be programmed by hot-electron injection.

FIG. 9 also shows a step of programming the memory cell $C_{i,j}$, that is similar to the one described above. Thus, the drain region D (n1) receives the drain voltage $VD_j$. The control gate receives a gate voltage $VG_i$ and the selection gate SG receives a selection voltage $VSEL_{i,i+1}$. The isolation layer NL of the well PW, which forms both the source region n0 and the source plane SP, receives the voltage VSP. A flow of electrons Ipe circulates in the opposite direction to the programming current. The flow of electrons passes through the vertical channel region CH2 extending opposite the gate SG, up to the pinch zone of the channel CH2, then passes through the gap GP and then the channel region CH1 to join the drain region n1. Hot electrons present in this flow of electrons are injected into the floating gate FG, under the effect of the transverse electric field created by the voltage VG, in an injection zone located in the channel region CH2, after the gap GP.

In this embodiment, the thickness of the lateral dielectric layer DL and the thickness of the dielectric layer D3 which overlaps the trench 10 are parameters which can be used to control the electrical characteristics of the memory cell:

the thickness of the dielectric layer D3 determines the threshold voltage of the memory cell in the channel region CH2 which itself modifies the injection performance of the memory cell for a given selection voltage. Thus, according to one embodiment, the dielectric layer D3 has a thickness much lower than the residual thickness of the lateral dielectric layer DL after etching the latter.

the thickness of the lateral dielectric layer DL determines both the maximum voltage difference VS–VG that can be supported by the layer DL and the distance between the vertical gate SG and the end of the channel region CH1, i.e., the extent of the gap GP, which also influences the injection performance. If, in the extreme, this thickness is zero, the vertical channel region CH2 is perfectly aligned with the end of the channel region CH1, which also maximizes the injection performance.

Figure 10:
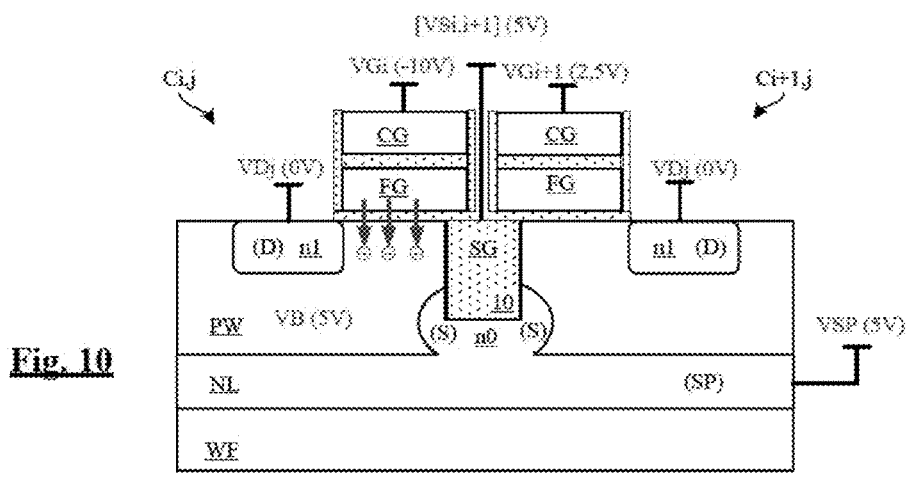
FIG. 10 shows a step of erasing a memory cell according to the present disclosure.

FIG. 10 shows a channel erase method of erasing a memory cell $C_{i,j}$ according to the present disclosure. The memory cell represented is that of FIG. 3 but the method is also applicable to the memory cell in FIG. 9. The drain region n1 receives a zero-value drain voltage $VD_j$. The control gate CG receives a negative erase voltage $VG_i$, for example −10V. The selection gate SG receives a positive selection voltage $VS_{i,i+1}$, for example 5V. The layer NL or source plane SP receives a positive voltage VSP, for example 5V. The substrate PW is thus taken to a positive voltage VB, here 5V. Electrons are extracted from the floating gate FG through the substrate PW, by tunnel effect, and are collected by the source plane SP. The twin memory cell $C_{i+1,j}$ receives on its control gate CG a positive erase-inhibit voltage $VG_{i+1}$, for example 2.5V.

Figure 3:
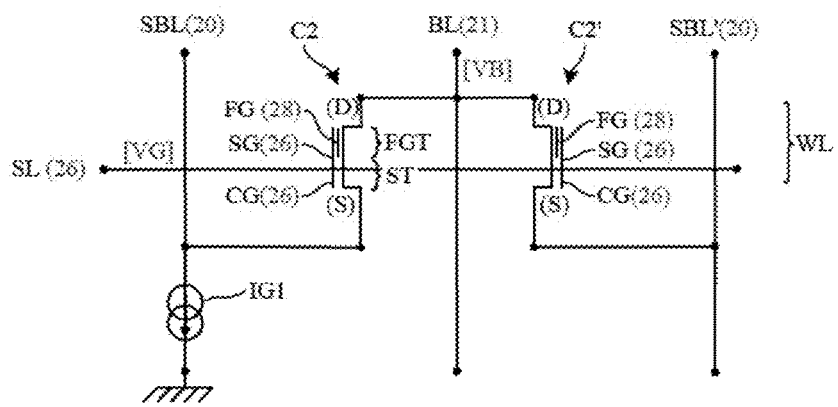
Figure 11:
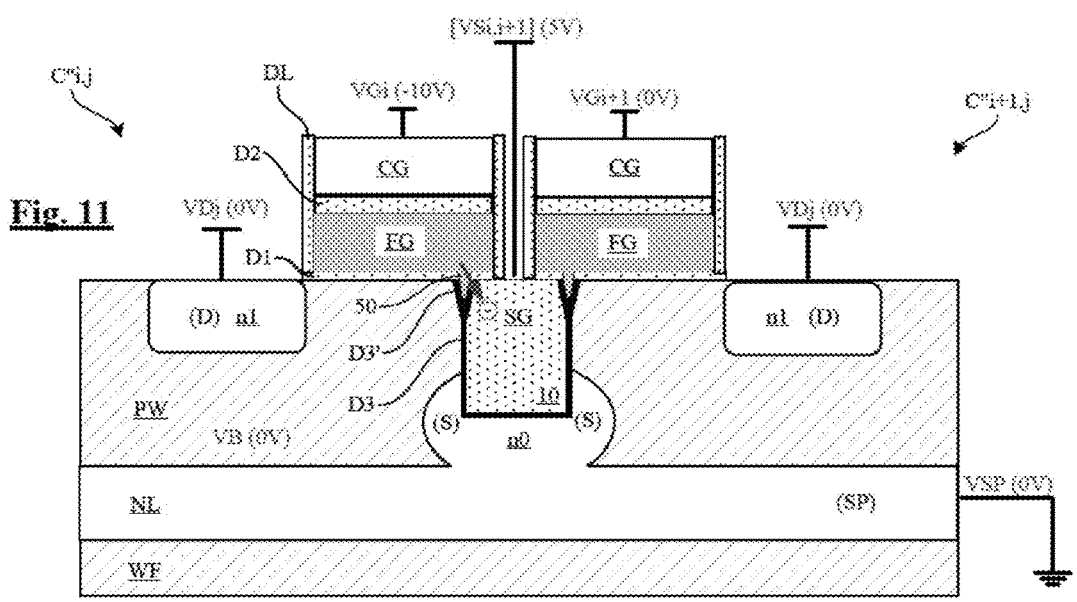
FIG. 11 is a cross-section of a third embodiment of a memory cell according to the present disclosure and shows a step of erasing the memory cell.

FIG. 11 shows an alternative $C''_{i,j}$ of the memory cell in FIG. 3 enabling the memory cell to be erased through the vertical selection gate SG, instead of being channel erased. The floating gate FG of the memory cell comprises a protuberance 50 which extends downwards and extends opposite a portion of the vertical gate SG. The protuberance 50 has been formed by widening in the vicinity of the surface of the substrate PW the dielectric layer D3 covering the trench 10, to obtain a widened portion D3' of the layer D3. The widening D3' is substantially in the shape of a "V" and receives the protuberance 50, that is separated from the vertical gate SG by a thin dielectric D3, of a few tens of micrometers, enabling the appearance of the tunnel effect between the protuberance 50 and the gate SG.

For the erasing of the memory cell, the drain D (n1) receives a zero-value drain voltage $VD_j$. The control gate CG receives a negative erase voltage $VG_i$, for example −10V. The vertical selection gate SG receives a positive selection voltage $VS_{i,i+1}$, for example 5V. The source plane is put to the ground (VSP=0). The voltage VB of the substrate PW is thus zero. The twin memory cell $C''_{i,j+1}$ receives on its control gate CG an erase-inhibit voltage $VG_{i+1}$ that is not necessarily positive and can be zero, due to the fact that the voltage VB of the substrate is zero. Under the effect of the voltage $VS_{i,i+1}$, electrons are extracted from the floating gate FG by the vertical gate SG, by tunnel effect, and are collected by the selection line to which the latter is connected.

It will be understood by those skilled in the art that split gate memory cells according to the present disclosure are susceptible of various other alternative embodiments. In particular, although the description above was of the formation of two twin memory cells, one embodiment of the method according to the present disclosure can aim to produce "unit" memory cells, i.e. without any twin memory cell sharing the same vertical selection gate. A memory cell according to the present disclosure is also susceptible of being manufactured using other fields of technology than those using silicon oxide as dielectric or polysilicon as gate material.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit memory, comprising:
   at least one word line that includes a row of split gate memory cells, each split gate memory cell including a selection transistor section, having an embedded vertical selection gate, and a floating-gate transistor section having a horizontal floating gate and a horizontal control gate;
   a selection line configured to apply a selection voltage to the selection gates of the memory cells of the row;
   a control gate line configured to apply a gate voltage to the control gates of the memory cells of the row;
   bit lines configured to individually apply a programming current to the memory cells;
   a source plane embedded beneath the memory cells and common to the memory cells of the word line, the source plane being configured to collect programming currents for programming the memory cells, wherein the selection transistor sections of the memory cells are electrically coupled to the source plane and the floating-gate transistor sections of the memory cells are electrically coupled to the bit lines; and
   a programming control circuit configured to control production of hot electrons in a vertical channel region of the selection transistor second and thereby simultaneously control hot electron injection into the floating gate of the memory cell by controlling the voltage applied to the vertical selection gate.

2. The memory according to claim 1, wherein the programming control circuit includes a test memory cell and is configured to control the selection voltage applied to the selection line based on a reference voltage at a terminal of the test memory cell when a reference current is provided to the test memory cell.

3. The memory according to claim 2, wherein the programming control circuit comprises:
   a reference current generator configured to produce a reference current in the test memory cell; and
   a selection driver coupled to the test memory cell and configured to apply to the selection line the selection voltage based on the reference voltage taken at the terminal of the test memory cell.

4. The memory according to claim 2, wherein the test memory cell includes a selection transistor section, having an embedded vertical selection gate, and a floating-gate transistor section having a horizontal floating gate and a horizontal control gate, and wherein the floating gate of the test memory cell is coupled to a DC voltage terminal configured to receive a DC voltage.

5. The memory according to claim 2, wherein the test memory cell includes a selection transistor section, having an embedded vertical selection gate, and a floating-gate transistor section having a horizontal floating gate and a horizontal control gate, and wherein the programming control circuit is configured to take the reference voltage at the selection gate of the selection transistor section of the first test memory cell.

6. The memory according to claim 5, wherein:
the test memory cell includes a selection transistor section, having an embedded vertical selection gate, and a floating-gate transistor section having a horizontal floating gate and a horizontal control gate; and
the programming control circuit includes a differential amplifier having first and second inputs and an output, the first input being electrically coupled to the terminal of the first test memory cell, the second input being configured to receive a DC voltage, and the output being electrically coupled to the selection gate of the selection transistor section of the test memory cell.

7. The memory according to claim 1, wherein the programming control circuit comprises:
a current measuring circuit configured to measure a current circulating in the selected bit line electrically coupled to the selected memory cell, and
a voltage control circuit configured to adjust the selection voltage based on the measured current circulating in the selected bit line.

8. The memory according to claim 7, wherein the current measuring circuit comprises a sense amplifier configured to apply a read voltage to the selected bit line and supply a binary datum having a logical value that changes when a current higher than a reference current circulates in the selected bit line.

9. The memory according to claim 8, wherein the programming control circuit is configured to:
calibrate the selection voltage by determining, by successive approaches, a reference selection voltage that causes the sense amplifier to change the logic state of the binary datum, and
program the selected memory cell using as the selection voltage a voltage that is equal to or a function of the determined reference selection voltage.

10. The memory according to claim 9, wherein the programming control circuit comprises:
voltage generator circuit configured to supply the reference selection voltage; and
a computing unit configured to read an output of the sense amplifier, and control the voltage generator circuit.

11. The memory according to of claim 7, wherein the selection gate of each memory cell is partially covered with the floating gate of the memory cell or is vertically aligned with a lateral dielectric layer covering a side of the floating gate.

12. The memory according to claim 7, wherein the current measuring circuit comprises:
a sense amplifier coupled to the selected bit line and configured to detect whether the current circulating in the selected bit line has reached a current threshold; and
a configuration register coupled to the sense amplifier and configured to configure the sense amplifier with the current threshold.

13. A method, comprising:
programming a selected memory cell of a memory that includes:

at least one word line that includes a row of split gate memory cells, each split gate memory cell including a selection transistor section, having an embedded vertical selection gate, and a floating-gate transistor section having a horizontal floating gate and a horizontal control gate, wherein the selected memory cell is one of the memory cells of the row;
a selection line configured to apply a selection voltage to the selection gates of the memory cells of the row;
a control gate line configured to apply a gate voltage to the control gates of the memory cells of the row;
bit lines configured to individually apply a programming current to the memory cells;
a source plane embedded beneath the memory cells and common to the memory cells of the word line, the source plane being configured to collect programming currents for programming the memory cells, wherein the selection transistor sections of the memory cells are electrically coupled to the source plane and the floating-gate transistor sections of the memory cells are electrically coupled to the bit lines; and
a programming control circuit, wherein the programming includes:
the programming control circuit controlling a programming current passing through the memory cell by controlling the selection voltage applied to the selection line and to the vertical selection gate and controlling production of hot electrons in a vertical channel region facing the vertical selection gate and thereby controlling hot electron injection performance of the memory cell.

14. Method according to claim 13, comprising generating the selection voltage using a voltage taken from a test memory cell passed through by a reference current (Ipref).

15. The method according to claim 14, wherein:
a reference current generator produces provides the reference current to the test memory cell; and
a selection driver, coupled to the test memory cell, applies to the selection line the selection voltage based on the reference voltage taken at the terminal of the test memory cell.

16. The method according to claim 14, wherein:
the test memory cell includes a selection transistor section, having an embedded vertical selection gate, and a floating-gate transistor section having a horizontal floating gate and a horizontal control gate;
the method includes applying a DC voltage directly to floating gate of the test memory cell; and
the controlling includes controlling the selection voltage applied to the selection line based on the reference voltage at the terminal of the test memory cell while the DC voltage is applied directly to the floating gate of the test memory cell.

17. The method according to claim 13, wherein the programming includes:
measuring a current circulating in the selected bit line, and
adjusting the selection voltage based on the current measured in the selected bit line.

18. The method according to claim 17, wherein measuring the current is performed using at least one sense amplifier configured that applies a read voltage to the selected bit line and changes a logical value of a binary datum when a current higher than a reference current circulates in the selected bit line.

19. The method according to claim 17, comprising:
calibrating the selection voltage by determining, by successive approaches, a reference selection voltage that causes a current in one of the bit lines to be a desired current value, wherein programming the selected memory cell includes using as the selection voltage a voltage that is equal to or a function of the reference selection voltage determined during the calibrating.

* * * * *